United States Patent

Shinbo et al.

[11] Patent Number: 5,236,892
[45] Date of Patent: Aug. 17, 1993

[54] METHOD FOR MANUFACTURING OXIDE SUPERCONDUCTING ARTICLE

[75] Inventors: Yukio Shinbo; Moriaki Ono; Makoto Kabasawa; Shigeyoshi Kosuga, all of Tokyo, Japan

[73] Assignee: NKK Corporation, Tokyo, Japan

[21] Appl. No.: 793,224

[22] Filed: Nov. 8, 1991

Related U.S. Application Data

[63] Continuation of Ser. No. 521,312, May 9, 1990, abandoned.

[30] Foreign Application Priority Data

May 29, 1989 [JP] Japan .................. 1-135110

[51] Int. Cl.$^5$ .................. B05D 5/12; B05D 3/02; B05D 3/06
[52] U.S. Cl. .................. 505/1; 505/733; 505/742; 427/62; 427/376.2; 427/419.3; 427/419.2; 427/596; 427/569; 427/592
[58] Field of Search .................. 505/1, 733, 742, 725; 427/62, 63, 376.2, 376.1, 419.3, 419.2, 53.1, 596, 592, 569

[56] References Cited

FOREIGN PATENT DOCUMENTS 0292959 11/1988 European Pat. Off. .
0310332  4/1989 European Pat. Off. .

OTHER PUBLICATIONS

Jin et al, "High critical currents in Y-Ba-Cu-O superconductors" Appl. Phys. Lett. 52(24) Jun. 1988 pp. 2074-2076.
Severin et al, "Superconducting YBa$_2$Cu$_3$Ox thin layers by solid state diffusion", Mat. Res. Bull. Vol. 23(1988) pp. 707-717.
Kumakura et al, "Ba-Y-Cu-O superconducting tape prepared by surface diffusion process," Jpn. J. Appl. Phys. 26(7) Jul. 1987 L1172-1173.
Applied Physics Letters, vol. 52, No. 11, Mar. 14, 1988, pp. 924-926, New York, US; C. Chang et al.: "Effects of silver and gold on the YBaCuO superconducting thin films with the use of Ag/Cu/BaO/Y$_2$O$_3$ and Ag/Cu/-BaO/Y$_2$O$_3$ structures".
Japanese Journal of Applied Physics, vol. 26, No. 9, Sep. 1987, pp. L1451-L1452, Tokyo, JP; Y. Sorimachi: "Formation of superconducting Y-Ba-Cu-O thin films by the solid phase reaction between BaCO$_3$/Cu/Y$_2$O$_3$ layers on single crystalline SrTiO$_3$ substrate".
Tachikawa et al, Fabrication of Superconducting Y-Ba-Cu Oxide Through an Improved Diffusion Process, Japanese Journal of Applied Physics, vol. 27, No. 8, Aug., 1988, pp. L1501-L1503.

*Primary Examiner*—Roy King
*Attorney, Agent, or Firm*—Frishauf, Holtz, Goodman & Woodward

[57] ABSTRACT

A method for manufacturing a superconducting article, comprising the steps of: forming a first layer comprising a mixture of LnBa$_2$Cu$_3$O$_x$ and Ln$_2$BaC oxid, on the surface of a substrate, said Ln being an optional rare earth element; then locally and sequentially/heating and melting the first layer to locally and sequentially form a molten pool of the mixture of the first layer, and causing the molten pool of the first layer to locally and sequentially solidify, thereby arranging the a-b plane of the crystal of the mixture of the first layer in parallel with the surface of the substrate; then forming a second layer comprising a mixture of at least CuO and BaCuO$_2$ on the surface of the first layer; and then melting the mixture of the second layer to cause the resultant melt of the mixture of the second layer to diffusion-react with Ln$_2$BaCu oxide, in the first layer so as to convert the first and second into a film of a superconducting substance comprising LnBa$_2$Cu$_3$O$_x$, in which the a-b plane of the crystal thereof is arranged in parallel with the surface of the substrate; thereby manufacturing a superconducting article comprising the substrate and the film of the superconducting substance formed on the surface of the substrate.

15 Claims, 2 Drawing Sheets

METHOD FOR MANUFACTURING OXIDE SUPERCONDUCTING ARTICLE

This application is a continuation of application Ser. No. 07/521,312, filed May 9, 1990, now abandoned.

REFERENCE TO PATENTS, APPLICATIONS AND PUBLICATIONS PERTINENT TO THE INVENTION

As far as we know, there is available the following prior art document pertinent to the present invention: "Japanese Journal of Applied Physics", Vol. 27, No. 8, pages L1501-L1503, published on Jul. 22, 1988.

The contents of the prior art disclosed in the above-mentioned prior art document will be discussed hereafter under the heading of the "BACKGROUND OF THE INVENTION".

FIELD OF THE INVENTION

The present invention relates to a method for manufacturing a superconducting article comprising a substrate and a film of a superconducting substance formed on the surface of the substrate.

BACKGROUND OF THE INVENTION

Superconducting materials have already been practically applied in the form of a superconducting magnet in a particle accelerator, a medical diagnosing instrument and the like. Potential applications of the superconducting materials include an electric power generator, an energy storage device, a linear motor car, a magnetic separator, a nuclear fusion reactor, a power transmission cable, and a magnetic shielder. In addition, a superconducting element using the Josephson effect is expected to be applied in such fields as an ultra-high speed computer, an infrared sensor and a low-noise amplifier. The magnitude of the industrial and social impacts which would be exerted upon the practical realization of these applications, is really unmeasurable.

One of the typical superconducting materials so far developed is an Nb-Ti alloy which is widely used at present as a magnetizing wire. The Nb-Ti alloy has a critical temperature, i.e., a critical temperature from which a superconductive state occurs (hereinafter simply referred to as "Tc") of 9K. As a superconducting material having a "Tc" considerably higher than that of the Nb-Ti alloy, a compound-type superconducting material has been developed, including an $Nb_3Sn$ (Tc: 18K) and $V_3Ga$ (Tc: 15K) which are now practically employed in the form of wire.

As a superconducting material having a "Tc" further higher than those of the above-mentioned alloy-type and compound-type superconducting materials, a composite oxide type superconducting material containing a $Cu_xO_y$-radical has recently been developed. For example, a Y-Ba-Cu-O type superconducting material has a "Tc" of about 93K. Since liquid nitrogen has a temperature of 77K, liquid nitrogen available at a lower cost than liquid helium can be used as a cooling medium for the composite oxide type superconducting material. Development of a superconducting material having a high "Tc" applicable at a temperature of liquid nitrogen urges further expectations for the foregoing fields of application. In the actual application, however, problems are how to process a superconducting material in the form of a film or a wire, and at the same time, how to increase a critical current density (hereinafter simply referred to as "Jc") of the superconducting material.

In order to increase the "Jc" of a superconducting material, it is necessary, when using the superconducting material in the form of a film, to make the structure of the film dense with a single superconducting phase.

A method for manufacturing a superconducting article, in which the "Jc" of a film of a superconducting material can be increased by making the structure of the film of the superconducting material dense with a single superconducting phase, is disclosed in the "Japanese Journal of Applied Physics", Vol. 27, No. 8, pages L1501-L1503, published on Jul. 22, 1988 (hereinafter referred to as the "prior art"). The prior art is described below with reference to the drawings.

FIG. 1 is a schematic descriptive view illustrating the former half steps of the method of the prior art for manufacturing a superconducting article, and FIG. 2 is a schematic descriptive view illustrating the latter half steps of the method of the prior art for manufacturing the superconducting article.

First, a sheet-shaped substrate 1 comprising $Y_2BaCu$ oxide, is prepared. Then, a mixture of CuO and $BaCO_3$, in which the ratio of copper (Cu) to barium (Ba) is Cu:Ba=5:3 in molar ratio, is primary-fired at a temperature of 800° C. for 24 hours, cooled, and pulverized into a powder. The powder of the thus primary-fired mixture is then secondary-fired at a temperature of 900° C. for 24 hours, cooled, and pulverized into a powder to prepare a powdery material for a film. Subsequently, the thus prepared powdery material for a film is mixed with ethyl alcohol to prepare a slurry for a film.

Then, the thus prepared slurry for a film is applied onto the surface of the substrate 1, and dried to form a film 2 comprising Ba-Cu oxides on the surface of the substrate 1, as shown in FIG. 1.

Then, the substrate 1, on the surface of which the film 2 has thus been formed, is heated in an electric furnace to melt the film 2 to cause the resultant melt of the Ba-Cu oxides in the film 2 to diffusion-react with $Y_2BaCu$ oxide, in the substrate 1, thereby converting the film 2 into a film 3 of a superconducting substance comprising $YBa_2Cu_3O_x$, as shown in FIG. 2.

Then, the film 3 of the superconducting substance thus produced is cooled to a room temperature, thereby manufacturing a superconducting article comprising a non-reacting substrate 1 and the film 3 of the superconducting substance formed on the surface of the non-reacting substrate 1, as shown in FIG. 2.

The above-mentioned prior art has the following effects: Since the film 3 of the superconducting substance comprising $YBa_2Cu_3O_x$ is produced through the diffusion-reaction of the resultant melt of the Ba-Cu oxides in the film 2 with $Y_2BaCu$ oxide, in the substrate 1, the structure of the film 3 of the superconducting substance is dense with a single superconducting phase, thus permitting manufacture of a superconducting article having a high "Jc".

However, the above-mentioned prior art has the following problems:

(1) When the film 3 of the superconducting substance comprising $YBa_2Cu_3O_x$ is produced on the surface of the substrate 1 through the diffusion-reaction of the resultant melt of the Ba-Cu oxides in the film 2 with $Y_2BaCu$ oxide, in the substrate 1, the film 3 of the superconducting substance expands in volume, causing cracks in the film 3 of the superconducting substance and resulting in seriously deteriorated superconducting properties of the superconducting article including a largely decreased "Jc".

(2) In order to further increase "Jc" of a superconducting article, it is necessary to arrange the a-b plane of the crystal of the superconducting substance of the film 3 in parallel with the surface of the substrate 1. The reason is that the a-b plane of the crystal of the superconducting substance permits the easiest flow of electric current. According to the above-mentioned prior art, however, the a-b plane of the crystal of the superconducting substance of the film 3 shows diverse and various orientations.

The above-mentioned problems (1) and (2) occur also in the case where the film 3 of a superconducting substance is produced by means of a compound containing an optional rare earth element other than "yttrium" (Y) in the above-mentioned $Y_2BaCu$ oxide and $YBa_2Cu_3O_x$. Such an optional rare earth element is hereinafter represented by "Ln".

SUMMARY OF THE INVENTION

An object of the present invention is therefore to provide a method for manufacturing a superconducting article, which permits prevention, when producing a film of a superconducting substance comprising $LnBa_2Cu_3O_x$ on the surface of a substrate through the diffusion-reaction, of the occurrence of cracks in the film of the superconducting substance, and arrangement of the a-b plane of the crystal of the superconducting substance of the film in parallel with the surface of the substrate, and as a result allows the manufacture of a superconducting article having excellent superconducting properties.

In accordance with one of the features of the present invention, there is provided a method for manufacturing a superconducting article, characterized by comprising the steps of:

forming a first layer comprising a mixture of $LnBa_2Cu_3O_x$ and $Ln_2BaCu$ oxide, on the surface of a substrate, said Ln being an optional rare earth element, and the content ratio of said $Ln_2BaCu$ oxide in said first layer being within the range of from 5 to 80 wt. % relative to the total amount of $LnBa_2Cu_3O_x$ and $Ln_2BaCu$ oxide; then locally and sequentially heating and melting said first layer to locally and sequentially form a molten pool of said mixture of said first layer, and causing said molten pool of said first layer to locally and sequentially solidify, thereby arranging the a-b plane of the crystal of said mixture of said first layer in parallel with the surface of said substrate; then forming a second layer comprising a mixture of at least CuO and $BaCuO_2$ on the surface of said first layer, said second layer having a melting point within the range of from 800° to 1,000° C., which is lower than the melting point of said first layer; then melting said mixture of said second layer, and keeping the molten state of said second layer for a period of time of from 1 minute to 4 hours in an oxygen-containing atmosphere to cause the resultant melt of said mixture of said second layer to diffusion-react with $Ln_2BaCu$ oxide, in said first layer, thereby converting said first layer and said second layer into a film of a superconducting substance comprising $LnBa_2Cu_3O_x$, in which the a-b plane of the crystal thereof is rranged in parallel with the surface of said substrate; and then cooling said film of said superconducting substance thus produced to a room temperature, thereby manufacturing a superconducting article comprising said substrate and said film of said superconducting substance formed on the surface of said substrate.

DETAILED DESCRIPTION OF PREFERRED EMBODIMENTS

From the above-mentioned point of view, extensive studies were carried out to develop a method for manufacturing a superconducting article, which permits prevention, when producing a film of a superconducting substance comprising $LnBa_2Cu_3O_x$ on the surface of a substrate through the diffusion-reaction, of the occurrence of cracks in the film of the superconducting substance, and arrangement of the a-b plane of the crystal of the superconducting substance of the film in parallel with the surface of the substrate, and as a result allows for the manufacture of a superconducting article having excellent superconducting properties.

As a result, the following findings were obtained:

(1) Cracks occur in the film of the superconducting substance comprising $LnBa_2Cu_3O_x$ because the film of the superconducting substance expands in volume when the film of the superconducting substance comprising $LnBa_2Cu_3O_x$ is produced on the surface of the substrate through the diffusion-reaction. Cracks can therefore be prevented from occurring in the film of the superconducting substance comprising $LnBa_2Cu_3O_x$, by reducing the amount of $LnBa_2Cu_3O_x$ produced through the diffusion-reaction to reduce the amount of expansion in volume of the film of the superconducting substance comprising $LnBa_2Cu_3O_x$.

(2) It is possible to arrange the a-b plane of the crystal of the film of a superconducting substance comprising $LnBa_2Cu_3O_x$ in parallel with the surface of the substrate by locally and sequentially heating and melting the film, formed on the surface of a substrate, comprising a mixture of $LnBa_2Cu_3O_x$ and $Ln_2BaCu$ oxide, to locally and sequentially form a molten pool of the mixture of the film, and causing the molten pool to locally and sequentially solidify.

The present invention was made on the basis of the above-mentioned findings (1) and (2). Now, an embodiment of the method of the present invention for manufacturing a superconducting article is described below with reference to the drawings.

Figure 1:
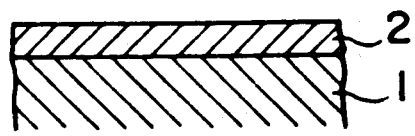
FIG. 1 is a schematic descriptive view illustrating the former half steps in the method of the prior art for manufacturing a superconducting article.
Figure 2:
FIG. 2 is a schematic descriptive view illustrating the latter half steps in the method of the prior art for manufacturing the superconducting article.
Figure 3:
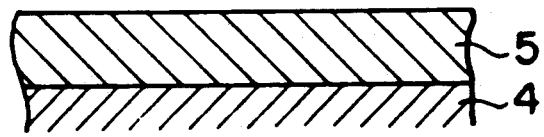
FIG. 3 is a schematic descriptive view illustrating a first step in an embodiment of the method of the present invention for manufacturing a superconducting article.
Figure 4:
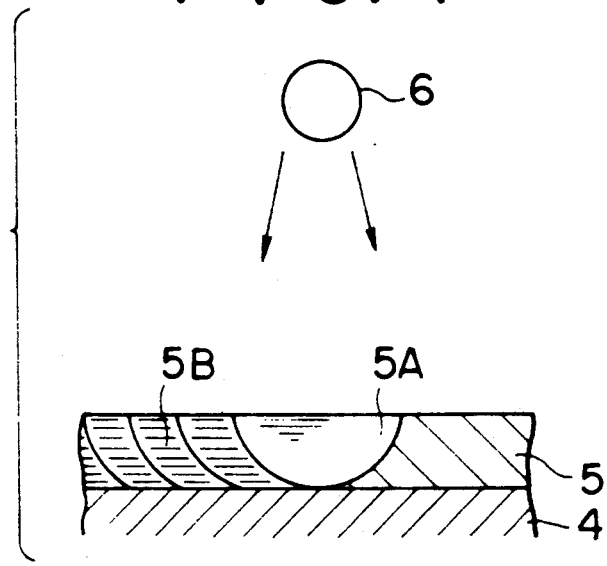
FIG. 4 is a schematic descriptive view illustrating a second step in the embodiment of the method of the present invention for manufacturing the superconducting article.
Figure 5:
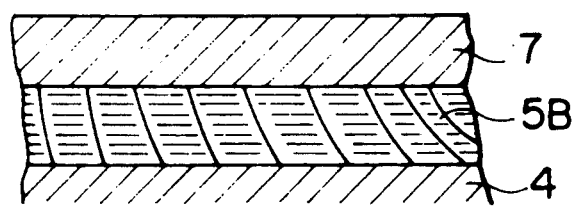
FIG. 5 is a schematic descriptive view illustrating a third step in the embodiment of the method of the present invention for manufacturing the superconducting article.
Figure 6:
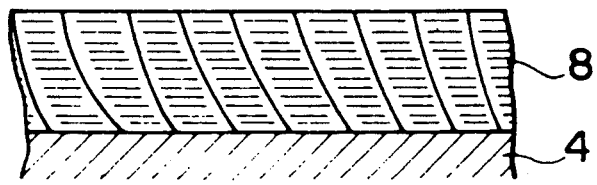
FIG. 6 is a schematic descriptive view illustrating a fourth step in the embodiment of the method of the present invention for manufacturing the superconducting article.

FIG. 3 is a schematic descriptive view illustrating a first step in an embodiment of the method of the present invention for manufacturing a superconducting article; FIG. 4 is a schematic descriptive view illustrating a second step in the embodiment of the method of the present invention for manufacturing the superconducting article; FIG. 5 is a schematic descriptive view illustrating a third step in the embodiment of the method of the present invention for manufacturing the superconducting article; and FIG. 6 is a schematic descriptive view illustrating a fourth step in the embodiment of the method of the present invention for manufacturing the superconducting article.

In the embodiment of the method of the present invention for manufacturing a superconducting article, a first layer 5 comprising a mixture of $LnBa_2Cu_3O_x$ and $Ln_2BaCu$ oxide, is formed in the first place on the surface of a substrate 4, as shown in FIG. 3, by means of the known plasma metallizing method or the like. The substrate 4 comprises any one of ceramics, silver, nickel and a nickel-based alloy, which hardly react with a superconducting substance comprising $LnBa_2Cu_3x$. The content ratio of $Ln_2BaCu$ oxide, in the first layer 5 should be within the range of from 5 to 80 wt. % relative to the total amount of $LnBa_2Cu_3O_x$ and $Ln_2BaCu$ oxide.

The content ratio of $Ln_2BaCu$ oxide, in the first layer is limited within the above-mentioned range for the following reason: With a content ratio of $Ln_2BaCu$ oxide, of under 5 wt. %, the amount of $Ln_2BaCu$ oxide, in the first layer 5 is insufficient relative to the amount of a mixture of a second layer described later, so that a non-reacting fraction of the mixture of the second layer remains in a film described later of a superconducting substance comprising $LnBa_2Cu_3O_x$, which film is to be formed on the surface of the substrate 4, thus causing deterioration of superconducting properties of the film of the superconducting substance. With a content ratio of $Ln_2BaCu$ oxide, of over 80 wt. %, on the other hand, the excessive amount of $Ln_2BaCu$ oxide, makes it impossible to prevent cracks from occurring in the film of the superconducting substance comprising $LnBa_2Cu_3O_x$, which cracks are caused by the expansion in volume of the film during formation thereof.

Then, as shown in FIG. 4, a heater 6 using a laser beam or electric resistance heat is installed above the substrate 4. The first layer 5 is locally and sequentially heated and melted by continuously moving the heater 6 in parallel with the surface of the substrate 4, thereby locally and sequentially forming a molten pool 5A of the above-mentioned mixture of the first layer 5, and the thus formed molten pool 5A of the mixture of the first layer 5 is caused to locally and sequentially solidify. With the progress of solidification of the molten pool 5A, $Ln_2BaCu$ oxide and $LnBa_2Cu_3O_x$ are recrystallized. The a-b plane of the crystal of the thus recrystallized $Ln_2BaCu$ oxide, and $LnBa_2Cu_3O_x$ grows in parallel with the surface of the substrate 4 along with the progress of solidification of the molten pool 5A. As a result, a reformed first layer 5B is formed, which comprises a mixture of $Ln_2BaCu$ oxide, and $LnBa_2Cu_3O_x$, in which the a-b plane of the crystal permitting the easiest flow of electric current is arranged in parallel with the surface of the substrate 4, on the surface of the substrate 4. Instead of continuously moving the heater 6 in parallel with the surface of the substrate 4, the substrate 4 may be continuously moved in parallel with the heater 6.

Then, as shown in FIG. 5, a second layer 7 having a melting point within the range of from 800° to 1,000° C. is formed by means of the known plasma metallizing method on the surface of the reformed first layer 5B. The second layer 7 comprises a mixture of at least CuO and $BaCuO_2$. A typical second layer 7 comprises a mixture of CuO, $BaCuO_2$ and BaO. In this case, the ratio of copper (Cu) to barium (Ba) in the second layer 7 should be within the range of Cu:Ba = 1:0.10 to 0.95 in molar ratio. Another example of the second layer 7 comprises a mixture of CuO, $BaCuO_2$, BaO, $Y_2O_3$ and $YBa_2Cu_3O_7$. In this case, the ratio of copper (Cu) to barium (Ba) and yttrium (Y) in the second layer 7 should be within the range of Cu:Ba:Y = 1:0.10 to 0.95:0.001 to 0.330 in molar ratio. Any of these mixtures of the second layer 7 diffusion-reacts with $Ln_2BaCu$ oxide, in the reformed first layer 5B, and as a result, the reformed first layer 5B and the second layer 7 are converted into a film of a superconducting substance comprising $LnBa_2Cu_3O_x$, as described below.

Then, the mixture of the second layer 7 is melted, and the molten state of the second layer 7 is kept for a period of time of from 1 minute to 4 hours in an oxygen-containing atmosphere to cause the resultant melt of the mixture comprising at least CuO and $BaCuO_2$ of the second layer 7 to diffusion-react with $Ln_2BaCu$ oxide, in the reformed first layer 5B, thereby converting the reformed first layer 5B and the second layer 7 into a film 8 of a superconducting substance comprising $LnBa_2Cu_3O_x$, as shown in FIG. 6. The arrangement of the a-b plane of the crystal of the mixture comprising $Ln_2BaCu$ oxide, and $LnBa_2Cu_3O_x$ of the reformed first layer 5B is never transformed even by the above-mentioned diffusion-reaction. Therefore, there is formed, on the surface of the substrate 4, the film 8 of the superconducting substance comprising $LnBa_2Cu_3O_x$, in which the a-b plane of the crystal is arranged in parallel with the surface of the substrate 4.

The period of time of keeping the molten state of the second layer 7 is limited within the range of from 1 minute to 4 hours for the following reason: With a period of time of the molten state of the second layer 7 of under 1 minute, the resultant melt of the mixture of the second layer 7 cannot be caused to sufficiently diffusion-react with $Ln_2BaCu$ oxide, in the reformed first layer 5B. With a period of time of the molten state of the second layer 7 of over 4 hours, on the other hand, conversion of the reformed first layer 5B and the second layer 7 into the film 8 of the superconducting substance comprising $LnBa_2Cu_3O_x$ does not progress further.

The thus produced film 8 of the superconducting substance is then cooled to a room temperature, thereby manufacturing a superconducting article comprising, as shown in FIG. 6, the substrate 4 and the film 8 of the superconducting substance formed on the surface of the substrate 4.

According to the embodiment of the method of the present invention for manufacturing a superconducting article, as described above, the reformed first layer 5B previously contains $LnBa_2Cu_3O_x$ in a prescribed amount, and this reduces the amount of $LnBa_2Cu_3O_x$ produced through the diffusion-reaction of the melt of the mixture of the second layer 7 with $Ln_2BaCu$ oxide, in the reformed first layer 5B. As a result, the amount of expansion in volume of the film 8 of the superconducting substance comprising $LnBa_2Cu_3O_x$ is reduced, thus preventing cracks from occurring in the film 8 of the superconducting substance. In addition, since the a-b plane of the crystal of the superconducting substance comprising $LnBa_2Cu_3O_x$ of the film 8 formed on the surface of the substrate 4 is arranged in parallel with the surface of the substrate 4, it is possible to manufacture a superconducting article having a very high "Jc".

Now, the method of the present invention for manufacturing a superconducting article is described in more detail by means of examples with reference to FIGS. 3 to 6.

EXAMPLE 1

A mixture comprising $CuO$, $BaCO_3$ and $Y_2O_3$, in which the ratio of copper (Cu) to barium (Ba) and yttrium (Y) was Cu:Ba:Y=2:1.5:1.5 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 10 hours, cooled and pulverized into a powder to prepare a powdery material for a first layer, having an average particle size within the range of from 26 to 44 μm. The thus prepared powdery material for the first layer comprised a mixture of $YBa_2Cu_3O_x$ and $Y_2BaCu$ oxide, and the content ratio of $Y_2BaCu$ oxide, in the powdery material for the first layer was 40 wt. % relative to the total amount of $YBa_2Cu_3O_x$ and $Y_2BaCu$ oxide.

On the other hand, a mixture comprising $CuO$ and $BaCO_3$, in which the ratio of copper (Cu) to barium (Ba) was Cu:Ba=2:1 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 30 minutes, cooled and pulverized into a powder to prepare a powdery material for second layer, having an average particle size within the range of from 26 to 44 μm. The thus prepared powdery material for the second layer comprised a mixture of $CuO$, $BaCuO_2$ and BaO.

Then, the powdery material for the first layer prepared as described above was blown by means of the known plasma metallizing method onto the surface of a substrate 4 comprising a nickel-based alloy and having a surface area of 1 $cm^2$ and a thickness of 1 mm, to form a first layer 5 having a thickness of 50 μm on the surface of the substrate 4, as shown in FIG. 3.

Then, as shown in FIG. 4, a heater 6 comprising a laser beam source having an output of 0.5 KW was installed above the substrate 4, and the heater 6 was continuously and horizontally moved in parallel with the surface of the substrate 4 at a speed of 1 m/minute while irradiating a laser beam from the heater 6 onto the first layer 5 formed on the surface of the substrate 4. As a result, the first layer 5 was locally and sequentially heated and melted to locally and sequentially form a molten pool 5A of the mixture comprising $YBa_2Cu_3O_x$ and $Y_2BaCu$ oxide, of the first layer 5 on the surface of the substrate 4, and the thus formed molten pool 5A of the above-mentioned mixture of the first layer 5 was locally and sequentially solidified. Consequently, a reformed first layer 5B comprising the above-mentioned mixture, in which the a-b plane of the crystal permitting the easiest flow of electric current was arranged in parallel with the surface of the substrate 4, was formed on the surface of the substrate 4.

Then, the powdery material for the second layer prepared as described above was blown by means of the known plasma metallizing method onto the surface of the reformed first layer 5B, to form a second layer 7 having a thickness of 50 μm on the surface of the reformed first layer 5B, as shown in FIG. 5.

Then, the substrate 4, on the surface of which the reformed first layer 5B and the second layer 7 were thus formed, was heated to a temperature of 950° C. in an electric furnace having an interior atmosphere of air to melt the second layer 7, and the molten state of the second layer 7 was kept for 30 minutes. This permitted the diffusion-reaction of the resultant melt of the mixture comprising $CuO$, $BaCuO_2$ and BaO of the second layer 7 with $Y_2BaCu$ oxide, in the reformed first layer 5B, whereby the reformed first layer 5B and the second layer 7 were converted into a film 8 of a superconducting substance comprising $YBa_2Cu_3O_x$ having a thickness of 70 μm, as shown in FIG. 6.

The substrate 4, on the surface of which the film 8 of the superconducting substance was thus produced, was slowly cooled in an electric furnace to a room temperature.

Thus, a superconducting article was manufactured, which comprised the substrate 4 comprising a nickel-based alloy and the film 8 of the superconducting substance comprising $YBa_2Cu_3O_x$, the a-b plane of the crystal of which was arranged in parallel with the surface of the substrate 4, formed on the surface of the substrate 4, as shown in FIG. 6.

Investigation of the thus manufactured superconducting article revealed that the structure of the film 8 of the superconducting substance was dense with a single superconducting phase, and the superconducting article had a "Jc" of 3,200 $A/cm^2$.

EXAMPLE 2

A mixture comprising $CuO$, $BaCO_3$ and $Y_2O_3$, in which the ratio of copper (Cu) to barium (Ba) and yttrium (Y) was Cu:Ba:Y=2.4:1.7:1.3 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 10 hours, cooled and pulverized into a powder to prepare a powdery material for a first layer, having an average particle size within the range of from 26 to 44 μm. The thus prepared powdery material for the first layer comprised a mixture of $YBa_2Cu_3O_x$ and $Y_2BaCu$ oxide, and the content ratio of $Y_2BaCu$ oxide, in the powdery material for first layer was 25 wt. % relative to the total amount of $YBa_2Cu_3O_x$ and $Y_2BaCu$ oxide.

On the other hand, a mixture comprising $CuO$, $BaCO_3$ and $Y_2O_3$, in which the ratio of copper (Cu) to barium (Ba) and yttrium (Y) was Cu:Ba:Y=26:13:1 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 30 minutes, cooled and pulverized into a powder to prepare a powdery material for a second layer, having an average particle size within the range of from 26 to 44 μm. The thus prepared powdery material for the second layer comprised a mixture of CuO, $BaCuO_2$, BaO, $Y_2O_3$ and $YBa_2Cu_3O_7$.

Then, the powdery material for the first layer prepared as described above was blown by means of the known plasma metallizing method onto the surface of a substrate 4 comprising a nickel-based alloy and having a surface area of 1 $cm^2$ and a thickness of 1 mm, to form a first layer 5 having a thickness of 50 μm on the surface of the substrate 4, as shown in FIG. 3.

Then, as shown in FIG. 4, a heater 6 comprising a laser beam source having an output of 0.5 KW was installed above the substrate 4, and the heater 6 was continuously and horizontally moved in parallel with the surface of the substrate 4 at a speed of 1 m/minute while irradiating a laser beam from the heater 6 onto the first layer 5 formed on the surface of the substrate 4. As a result, the first layer 5 was locally and sequentially heated and melted to locally and sequentially form a molten pool 5A of the mixture comprising $YBa_2Cu_3O_x$ and $Y_2BaCu$ oxide, of the first layer 5 on the surface of the substrate 4, and the thus formed molten pool 5A of the above-mentioned mixture of the first layer 5 was locally and sequentially solidified. Consequently, a reformed first layer 5B comprising the above-mentioned mixture, in which the a-b plane of the crystal permitting the easiest flow of electric current was arranged in parallel with the surface of the substrate 4, was formed on the surface of the substrate 4.

Then, the powdery material for the second layer prepared as described above was blown by means of the known plasma metallizing method onto the surface of the reformed first layer 5B, to form a second layer 7 having a thickness of 50 μm on the surface of the reformed first layer 5B, as shown in FIG. 5.

Then, the substrate 4, on the surface of which the reformed first layer 5B and the second layer 7 were thus formed, was heated to a temperature of 950° C. in an electric furnace having an interior atmosphere of air to melt the second layer 7, and the molten state of the second layer 7 was kept for 30 minutes. This permitted the diffusion-reaction of the resultant melt of the mixture comprising CuO, $BaCuO_2$, BaO, $Y_2O_3$ and $YBa_2Cu_3O_7$ of the second layer 7 with $Y_2BaCu$ oxide in the reformed first layer 5B, whereby the reformed first layer 5B and the second layer 7 were converted into a film 8 of a superconducting substance comprising $YBa_2Cu_3O_x$ having a thickness of 70 μm, as shown in FIG. 6.

Then, the substrate 4, on the surface of which the film 8 of the superconducting substance was thus produced, was slowly cooled in the electric furnace to a room temperature.

Thus, a superconducting article was manufactured, which comprised the substrate 4 comprising a nickel-based alloy and the film 8 of the superconducting substance comprising $YBa_2Cu_3O_x$, the a-b plane of the crystal of which was arranged in parallel with the surface of the substrate 4, formed on the surface of the substrate 4, as shown in FIG. 6.

Investigation of the thus manufactured superconducting article revealed that the structure of the film 8 of the superconducting substance was dense with a single superconducting phase, and the superconducting article had a "Jc" of 3,300 $A/cm^2$.

According to the method of the present invention, as described above in detail, it is possible to manufacture a superconducting article having excellent superconducting properties, in which, when a film of a superconducting substance comprising $LnBa_2Cu_3O_x$ is produced on the surface of a substrate through the diffusion-reaction, cracks are prevented from occurring in the film of the superconducting substance, and the a-b plane of the crystal of the superconducting substance of the film is arranged in parallel with the surface of the substrate, thus providing industrially useful effects.

What is claimed is:

1. A method for manufacturing an oxide superconducting article, comprising the steps of:
   - forming a first layer comprising a mixture of a superconductor $LnBa_2Cu_3$ oxide and $Ln_2BaCu$ oxide on a surface of a substrate selected from the group consisting of ceramics, silver, nickel and a nickel-based alloy, said Ln being a rare earth element, said mixture of the superconductor $LnBa_2Cu_3$ oxide and the $Ln_2BaCu$ oxide being prepared by subjecting a mixture of CuO, $BaCO_3$ and $Ln_2O_3$ to a plurality of treatments, each comprising a firing, a cooling and a pulverizing, and the content ratio of said $Ln_2BaCu$ oxide in said first layer being from 5 to 80 wt. % relative to the total amount of the superconductor $LnBa_2Cu_3$ oxide and the $Ln_2BaCu$ oxide; then
   locally and sequentially heating and melting said first layer to locally and sequentially form a molten pool of said mixture of said first layer, and causing said molten pool of said first layer to locally and sequentially solidify, thereby arranging the a-b plane of the crystal of said mixture of said first layer in parallel with the surface of said substrate; then
   forming a second layer comprising a mixture of at least CuO and $BaCuO_2$ on the surface of said layer, said second layer having a melting point of from 800° to 1,000° C., which is lower than the melting point of said first layer; then
   melting said mixture of said second layer, and maintaining the molten state of said second layer for a period of time of from 1 minute to 4 hours in an oxygen-containing atmosphere to cause the resultant melt of said mixture of said second layer to diffusion-react with the $Ln_2BaCu$ oxide in said first layer, thereby converting said first layer and said second layer into a film of an oxide superconductor comprising a superconductor $LnBa_2Cu_3$ oxide in which the a-b plane of the crystal thereof is arranged in parallel with the surface of said substrate; and then
   cooling said film of said oxide superconductor thus produced to room temperature, thereby manufacturing said superconducting article comprising said substrate and said film of said oxide superconductor formed on the surface of said substrate.

2. The method as claimed in claim 1, wherein:
   said second layer comprises a mixture of CuO, $BaCuO_2$ and BaO; and
   the molar ratio of copper (Cu) to barium (Ba) in said second layer is Cu:Ba = 1:0.10 to 0.95.

3. The method as claimed in claim 1, wherein:
   said second layer comprises a mixture of CuO, $BaCuO_2$, BaO, $Y_2O_3$ and $YBa_2Cu_3O_7$; and
   the molar ratio of copper (Cu) to barium (Ba) and yttrium (Y) in said second layer is Cu:Ba:Y = 1:0.10 to 0.95:0.001 to 0.330.

4. The method as claimed in claim 1, wherein the first layer is formed on the surface of the substrate by plasma metallizing.

5. The method as claimed in claim 1, wherein the local and sequential heating is conducted by an electric resistance heater.

6. The method as claimed in claim 1, wherein the local and sequential heating is conducted by a laser beam.

7. The method a claimed in claim 1, wherein the local and sequential heating is conducted by continuously moving a heater disposed above said substrate parallel with the surface of said substrate.

8. The method as claimed in claim 1, wherein the local and sequential heating is conducted by continuously moving the substrate parallel with a heater positioned above said substrate.

9. The method as claimed in claim 1, wherein the second layer is formed on the surface of the first layer by plasma metallizing.

10. The method as claimed in claim 1, wherein Ln is Y.

11. The method as claimed in claim 1, wherein the first layer comprises a mixture of a superconductor $YBa_2Cu_3$ oxide and a $Y_2BaCu$ oxide and the content ratio of the $Y_2BaCu$ oxide in the first layer is 40 wt.% relative to the total amount of the superconductor $YBa_2Cu_3$ oxide and the $Y_2BaCu$ oxide; the substrate is a nickel-based alloy; and the second layer comprises a mixture of $CuO$, $BaCuO_2$ and $BaO$.

12. The method as claimed in claim 1, wherein the first layer comprises a mixture of a superconductor $YBa_2Cu_3$ oxide and a $Y_2BaCu$ oxide and the content ratio of the $Y_2BaCu$ oxide in the first layer is 25 wt. % relative to the total amount of the superconductor $YBa_2Cu_3$ oxide and the $Y_2BaCu$ oxide; the substrate is a nickel-based alloy; and the second layer comprises a mixture of $CuO$, $BaCuO_2$, $BaO$, $Y_2O_3$ and $YBa_2Cu_3O_7$.

13. The method as claimed in claim 1, wherein the second layer comprises a mixture of $CuO$, $BaCuO_2$ and $BaO$.

14. The method as claimed in claim 1, wherein the second layer comprises a mixture of $CuO$, $BaCuO_2$, $BaO$, $Y_2O_3$ and $YBa_2Cu_3O_7$.

15. The method of claim 8, wherein the heater is a laser beam moving at a velocity of 1 m/minute.

* * * * *

UNITED STATES PATENT AND TRADEMARK OFFICE
CERTIFICATE OF CORRECTION

PATENT NO.   :   5,236,892
DATED        :   August 17, 1993
INVENTOR(S)  :   SHINBO et al It is certified that error appears in the above-identified patent and that said Letters Patent is hereby corrected as shown below:

On the title page, item [75] iventors, delete
    "Kosuga" and insert --Kosuge--.

Title page, right column, [57] ABSTRACT, line 5:
    delete "sequentially/heating" and
    insert --sequentially heating--.

Column 11, line 10 (Claim 7):  delete "a" and
    insert --as--.

Signed and Sealed this

Third Day of January, 1995

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO. : 5,236,892

DATED : August 17, 1993

INVENTOR(S) : SHINBO et al

It is certified that error appears in the above-identified patent and that said Letters Patent is hereby corrected as shown below:

Column 12, line 22 (Claim 15): delete "claim 8" and insert --claim 7--.

Signed and Sealed this

Twenty-eight Day of March, 1995

Attest:

BRUCE LEHMAN

Attesting Officer

Commissioner of Patents and Trademarks